(12) United States Patent
Sakuma et al.

(10) Patent No.: US 6,788,012 B2
(45) Date of Patent: Sep. 7, 2004

(54) CIRCUIT FOR GENERATING HIGH VOLTAGE PULSE

(75) Inventors: Takeshi Sakuma, Nagoya (JP); Katsuji Iida, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 09/884,855

(22) Filed: Jun. 19, 2001

(65) Prior Publication Data

US 2002/0180276 A1 Dec. 5, 2002

(30) Foreign Application Priority Data

May 31, 2001 (JP) .......................... 2001-164971

(51) Int. Cl.[7] .................. H01J 11/04; F23Q 7/00
(52) U.S. Cl. ............... 315/344; 315/355; 315/356; 315/285; 361/250; 361/249
(58) Field of Search ............... 315/344, 355, 315/356, 285, 287, 348, 362, 209 CD, 209 M, 209 SC, 209 R, 218, 241 R, DIG. 7, 267, 275, 227 A; 361/250, 249, 248, 253, 257, 26, 25; 307/10.3, 10.6

(56) References Cited

U.S. PATENT DOCUMENTS 3,591,830 A * 7/1971 Woolsey ............... 315/290
4,275,317 A * 6/1981 Frosch et al. ......... 307/415
4,549,091 A * 10/1985 Fahlen et al. ......... 307/106
6,268,754 B1 * 7/2001 Sakuma et al. ....... 327/283

* cited by examiner

Primary Examiner—Tuyet T. Vo
(74) Attorney, Agent, or Firm—Burr & Brown

(57) ABSTRACT

A simple and less expensive high voltage pulse generating circuit including a low voltage direct current voltage source having one output terminal connected to another output terminal via a series circuit of a first switch with a low withstand voltage, an inductance storing inductive energy and a second switch with a high withstand voltage, and a branch circuit including a free-wheel diode connected between the other output terminal of the direct current voltage source and a common connection point between the first switch and the inductance. After storing inductive energy in the inductance by turning "on" the first and second switches, these first and second switches are turn "off" to commutate the energy stored in the inductance into a capacitive load connected across the second switch to charge the load abruptly and generate a high voltage pulse having a very narrow width without using a complicated and expensive magnetic compression circuit.

11 Claims, 7 Drawing Sheets

CIRCUIT FOR GENERATING HIGH VOLTAGE PULSE

BACKGROUND OF THE INVENTION

1. Field of the Invention

The present invention relates to a circuit for generating a high voltage pulse having an extremely high voltage and a large content with the aid of semiconductor switches.

2. Related Art Statements

In order to generate plasma, an abruptly raising high voltage pulse of several kV to several tens kV having a very short duration (sometimes 50 nano seconds is required) has to be applied to a load, i.e. a discharge gap provided in a plasma generating reactor.

FIG. 1 is a circuit diagram showing a principal structure of a known high voltage generating circuit. A DC supply source 1 having a high output voltage which is equal to a voltage of an output high voltage pulse is connected across a pulse energy supplying capacitor 3 via a charging resistor 2. The capacitor 3 is connected across a load (discharging site) 5 via a switch 4. After charging the capacitor 3, when the switch 5 is made conductive, energy is transferred from the capacitor 3 to the load 5.

An inductance existing in a path of a current flowing from the capacitor 3 to the load 5 through the conducting switch 4 is denoted by an inductance 6 in FIG. 1. The load 5 is formed by the discharge gap and it generally consisting of a capacitive element. In FIG. 1, for the sake of explanation, this capacitive element of the load 5 is denoted by a capacitor 7 connected in parallel with the discharge gap 5. When the switch 4 is made conductive, a current flows to the capacitor 7 and the capacitor is charged. The larger and steeper this current is, the steeper the output pulse generated across the capacitor 7 becomes. In this manner, a preferable pulse for the plasma discharge can be attained. However, in practice, the switch 4 has a finite switching time and could not be made conductive instantaneously, and the relatively large inductance 6 is always existent in the circuit. Therefore, a raising edge of the output pulse could not be steep and an output pulse having a short duration could not be generated.

In order to solve the above explained problem of the known pulse generating circuit, there has been proposed a magnetic compression circuit utilizing a saturable iron core. FIG. 2 illustrates such a magnetic compression circuit. In FIG. 2, elements similar to those shown FIG. 1 are denoted by same reference numerals used in FIG. 1 and their detailed explanation is dispensed with. A series circuit of saturable iron or magnetic cores 8-1, 8-2 and 8-3 is connected across the switch 4 and the load 5, capacitors 3-1, 3-2 and 3-3 are connected between terminals of these saturable iron cores and a negative terminal of the DC supply source 1, and a saturable iron core 8 is connected across the load 5.

An inductance of the saturable iron core is very high until the core is saturated, and when a product of a voltage and time reaches a predetermined value, the inductance of the saturable iron core decreases abruptly. For the sake of explanation, it is assumed that inductance values of the saturable iron cores 8-1, 8-2, 8-3 and 8 are decreased in this order and the capacitors 3-1, 3-2 and 3-3 have a same capacitance value. After the switch 4 has been made conductive and the saturable iron core 8-1 has been saturated at an instance $T_0$, voltage pulses v1, v2 and v3 appearing across the capacitors 3-2, 3-3 and 7 are successively compressed on a time axis as depicted in FIG. 3. That is to say, the voltage pulse v1 appearing across the capacitor 3-2 begins to increase from the Instance $T_0$ and becomes maximum after a time duration $T_1$. Since the circuit Is designed such that the saturable iron core 8-2 is saturated at such a time instance, the voltage pulse v2 appearing across the capacitor 3-3 begins to raise and becomes maximum after a time period $T_2$. At this time, the saturable iron core 8-3 is saturated and the voltage pulse v3 begins to raise. After a time period $T_3$ which is shorter than the time period $T_2$, the voltage pulse v3 reaches a maximum value. In this manner, the voltage pulse v3 having a sharp raising edge as well as a relatively short pulse width can be applied across the load 5.

As illustrated in FIG. 2, the known high voltage pulse generating circuit including the saturable reactors has a complicated construction. Since a high voltage is applied to all the elements in the circuit, it is required to use special parts, and it is also required to provide a longer insulation distance. Moreover, the DC supply source 1 has to generate a high voltage. In this manner, the known circuit is liable to be large in size and expensive in cost.

In the known high voltage pulse generating circuit, the switch 4 is generally formed by a thyratron which is a kind of vacuum tube. Since the thyratron has a very high switching speed and can be used under a high voltage, the switch 4 can be formed by a single thyratron, and therefore an inductance of the switch 4 is small. However, the thyratron has the following demerits:

(1) The thyratron cannot operate at a high repetition frequency.
(2) The thyratron cannot be self-turned off and thus a limitation is imposed upon designing the circuit.
(3) The thyratron has a short lifetime and maintenance is cumbersome and expensive.
(4) The thyratron requires a heater circuit as well as a gas control, and therefore the overall circuit is liable to be complicated.
(5) The thyratron malfunctions due to jitter and miss-ignition.

Recently semiconductor switches have been developed in accordance with the progress of power electronics, and there have been designed semiconductor switches which can turn-on and turn-off a large current under a high voltage. However, a semiconductor switch has a lower withstand voltage and could not be substituted for the thyratron. A switch is composed of a series circuit of a number of semiconductor switches and a necessary circuit voltage is sheared by these semiconductor switches. In order to turn-on simultaneously the semiconductor switches connected in series, it is necessary to provide special gate driving circuits. Furthermore, a high voltage is applied between the gate driving circuits, and therefore gate power sources and gate control signals have to be isolated from each other. In general, a remarkable advantage could not be attained by only replacing the thyratron by a series circuit of semiconductor switches.

Recently semiconductor switches have been developed in accordance with the progress of power electronics, and there have been designed semiconductor switches which can turn-on and turn-off a large current under a high voltage. However, a semiconductor switch has a lower withstand voltage and could not be substituted for the thyratron. A switch is composed of a series circuit of a number of semiconductor switches and a necessary circuit voltage is shared by these semiconductor switches. In order to turn-on simultaneously the semiconductor switches connected in series, it is necessary to provide special gate driving circuits. Furthermore, a high voltage is applied between the gate driving circuits, and therefore gate power sources and gate control signals have to be isolated from each other. In general, a remarkable advantage could not be attained by only replacing the thyratron by a series circuit of semiconductor switches.

As explained above, in the known high voltage pulse generating circuit, a high DC voltage source is required and all the circuit components are subjected to a high voltage. Moreover, a pulse having a short width could not be produced due to a limitation in switching speed and a circuit inductance, and therefore the magnetic compression circuit has to be used. Then, the circuit becomes large and expensive.

SUMMARY OF THE INVENTION

The present invention has for its object to provide a simple and low cost high voltage generating circuit which can generate directly a narrow high voltage pulse raising sharply without using the magnetic compression circuit by effectively utilizing the circuit inductance.

It is another object of the invention to provide a high voltage generating circuit which can generate a narrow and steep high voltage by means of semiconductor switches having turn-off faculty and operating with a relatively low DC voltage source.

According to the invention, a high voltage pulse generating circuit comprises:
- a DC voltage source having first and second output terminals;
- a first switch having one end connected to said first output terminal of said DC voltage source;
- a branch circuit including a free-wheel diode connected across the other end of said first switch and said second output terminal of the DC voltage source; and
- a series circuit including an inductance and a second switch and connected in parallel with said branch circuit;
- wherein after making said first and second switch on to store inductive energy in said inductance, the energy stored in the inductance is commuted to a load connected across said second switch by turning-off said first and second switches.

In the high voltage generating circuit according to the invention, said first and second switches may be formed by first and second semiconductor switches. In such a case, a low DC voltage is applied to the inductance through the first and second semiconductor switches to store inductive energy in the inductance, and then the first and second semiconductor switches are turned-off to commutate the inductive energy to a load capacitance of a low inductance circuit. By charging the load capacitance abruptly, it is possible to generate a high voltage pulse having a narrow width.

In a preferable embodiment of the high voltage pulse generating circuit according to the invention, said first semiconductor switch is constituted by a semiconductor switching element having a low withstand voltage and said second semiconductor switch is constructed by a series circuit of a plurality of semiconductor switching elements having a high withstand voltage, the number of said plurality of semiconductor switching elements being determined in accordance with an amplitude of an output voltage pulse to be generated. There are further provided a plurality of iron cores, the number of which is equal to that of said plurality of semiconductor switching elements. A primary winding passing through said plurality of iron cores is connected in series with said free-wheel diode, and a plurality of secondary windings each passing through respective iron cores are connected to gates and cathode terminals of respective semiconductor switching elements of said series circuit of semiconductor switching elements. In this case, it is particularly preferable that each of the semiconductor switching elements of said series circuit is formed by a static induction thyristor. However, according to the invention, the semiconductor switching elements may be formed by another semiconductor switching element such as an insulated gate bipolar transistor (IGBT) which has a turn-off faculty.

In a preferable embodiment of the high voltage pulse generating circuit according to the invention, after discharging the energy to the load by turning-off the second switch, the second switch is turned-on again for a very short time period. Furthermore, said first and second switches may be turned off simultaneously or at different timings.

DESCRIPTION OF THE PREFERRED EMBODIMENTS

Figure 1:
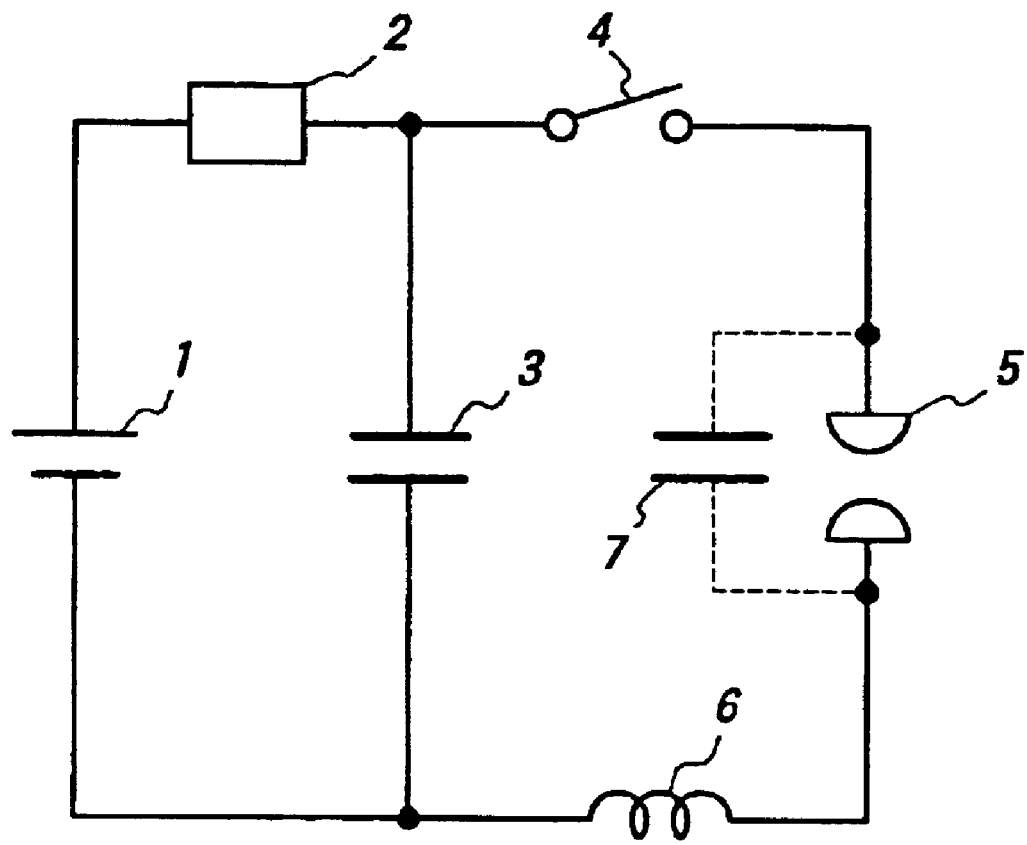
FIG. 1 is a circuit diagram showing a principal structure of a known high voltage pulse generating circuit.
Figure 2:
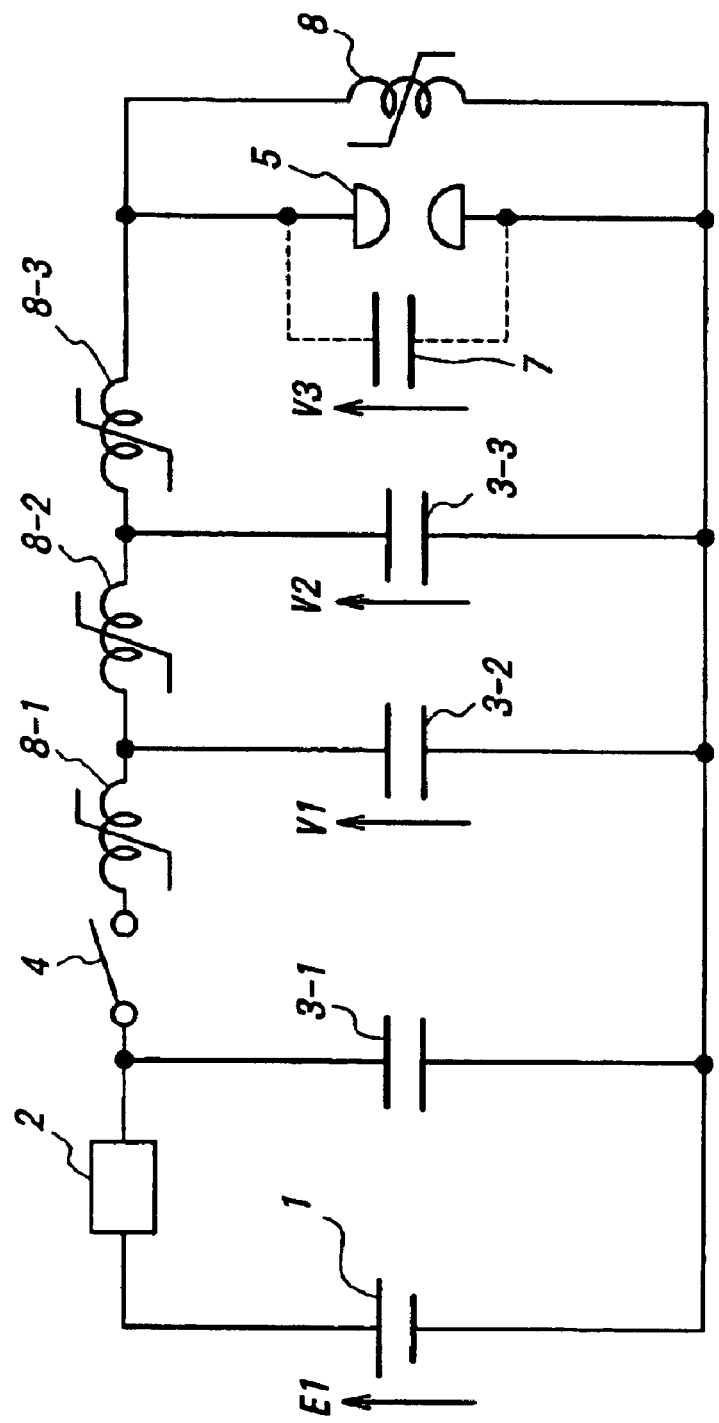
FIG. 2 is a circuit diagram illustrating a known high voltage pulse generating circuit including a magnetic compression circuit.
Figure 3:
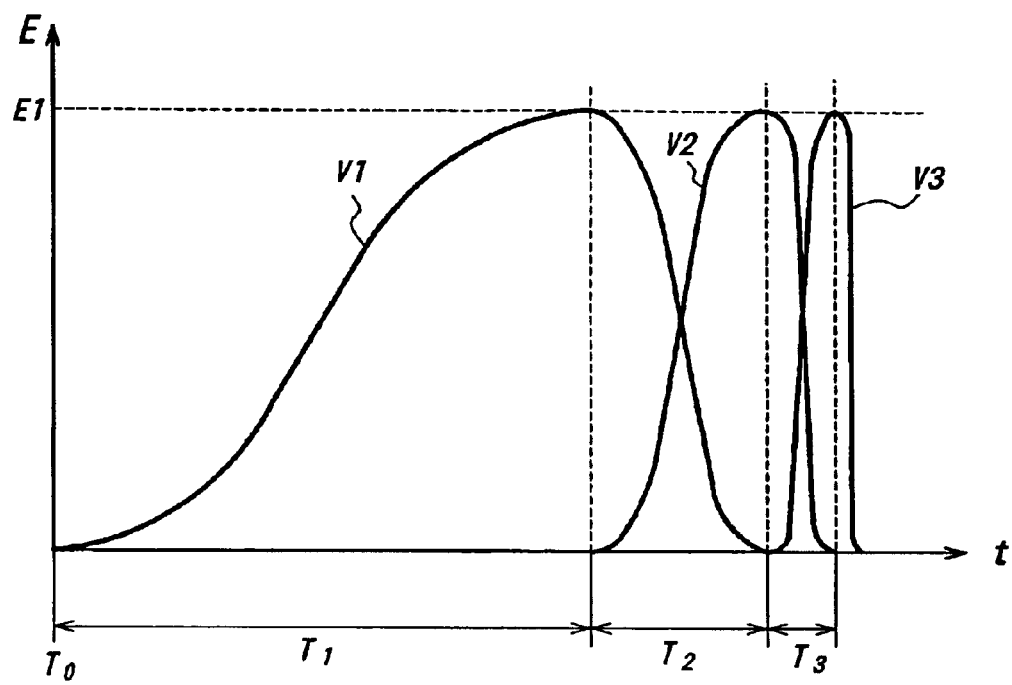
FIG. 3 is a signal waveform explaining the known high voltage pulse generating circuit shown in FIG. 2.
Figure 4:
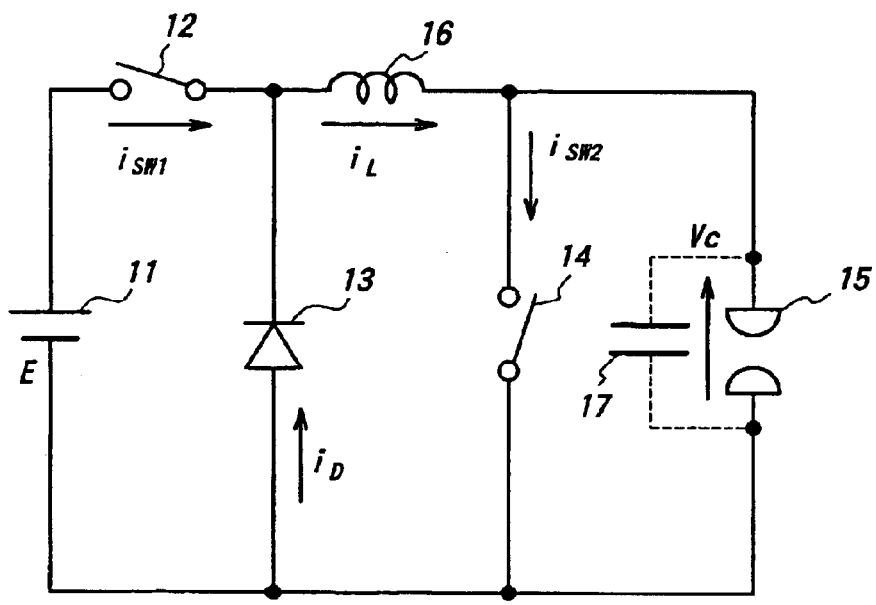
FIG. 4 is a circuit diagram depicting a first embodiment of the high voltage pulse generating circuit according to the principal conception of the invention.

FIG. 4 is a circuit diagram showing a first embodiment of the high voltage pulse generating circuit according to the principal conception of the present invention. There is arranged a low DC voltage source 11 whose output voltage can be determined regardless of an amplitude of an output high voltage pulse to be generated. A positive output terminal of the DC voltage source 11 connected to its negative output terminal by means of a series circuit of a first switch 12 having turn-on and turn-off faculty and a lower withstand voltage, an inductance 16 for storing a inductive energy, and a second switch 14 having turn-on and turn-off faculty and a higher withstand voltage. The first switch 11 having the turn-on and turn-off faculty serves to perform the supply and stop of the inductive energy to the inductance 16 and can be formed by a switching element having a lower withstand voltage. The second switch 14 also having the turn-on and turn-off faculty operates to perform the supply and release of the inductive energy of the inductance 16 and the output high voltage is applied to the second witch. Therefore, the second switch 14 should have a higher withstand voltage than that of the first switch 12.

A branch circuit including a free-wheel diode 13 is connected across a common connection point between said first switch 12 and said inductance 16 and the negative output terminal of the DC voltage source 11. Since the high output voltage is not applied to the free-wheel diode 13, this diode may be of a lover withstand voltage. In parallel with the second switch 14, is connected a load 15, which may be a discharge gap provided in a plasma generating reactor. A capacitor 17 representing the capacitive load 15 is shown in FIG. 4.

Figure 5A:
FIGS. 5A–5H are signal waveforms representing the operation of the high voltage pulse generating circuit illustrated in FIG. 4.

Now the operation of the high voltage pulse generating circuit according to the invention will be explained with reference to FIG. 5. FIG. 5A represents an on-off condition of the first switch 12, FIG. 5B an on-off condition of the second switch 14, FIG. 5C a current $i_{sw1}$ flowing through the first switch 12, FIG. 5D a circuit $i_L$ passing through the inductance 16, FIG. 5E a current $i_{sw2}$ flowing through the second switch 14, FIG. 5F a current $i_D$ flowing through the free-wheel diode 13, FIG. 5G a resonance current $i_c$ passing through the capacitor 17, and FIG. 5H shows a voltage appearing across the capacitor 17, i.e. the output high voltage pulse Vc.

Now it is assumed that the first and second switches 12 and 14 are turned-on at a timing $t_0$. It should be noted that according to the invention, the second switch 14 may be turned-on prior to the first switch 12. Then, a low voltage E of the DC voltage source 11 is applied to the inductive energy storing inductance 16 (having an inductance value L) and the current $i_L$ passing through the inductance 16 increases linearly with an inclination of E/L (FIG. 5C). That is to say, the inductive energy is stored in the inductance 16. In a first mode I shown in FIG. 5H, this current $i_L$ is equal to the current $i_{sw1}$ passing through the first switch 12 and the current $i_{sw2}$ passing through the second switch 14.

Figure 5B:
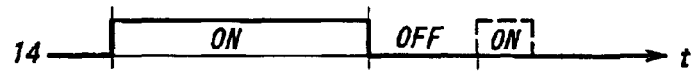
Figure 5C:
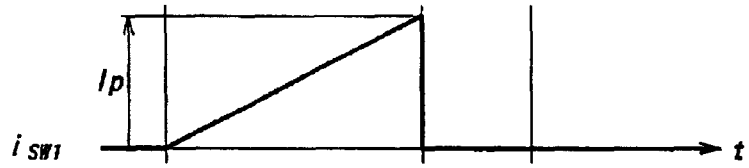
Figure 5D:
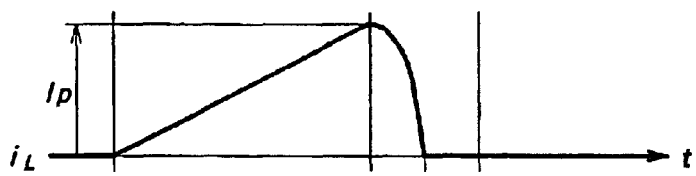
Figure 5E:
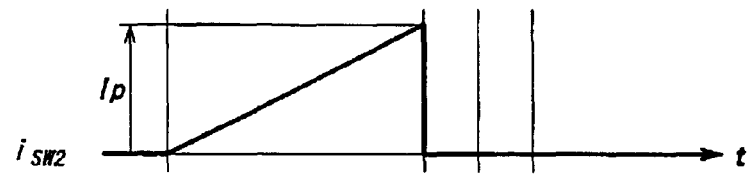
Figure 5F:
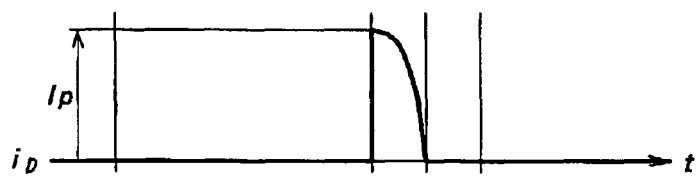
Figure 5G:
Figure 5H:
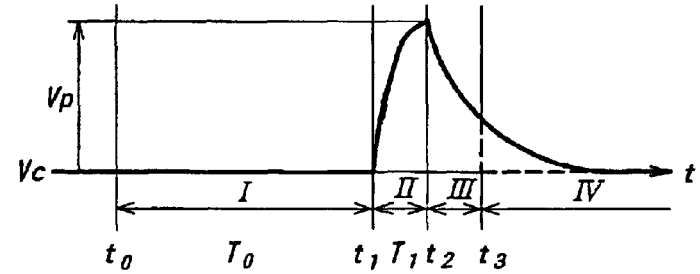

When the current passing through the inductive energy storing inductance 16 reaches a given current Ip at an instance $t_1$, the first and second switches 12 and 14 are turned-off (FIGS. 5A and 5B). In this case, the first and second switches may be turned-off at different timings, but for the sake of explanation, the first and second switches are turned-off simultaneously. In a second mode 11 which is initiated at the turn-off of the first and second switches 12 and 14, the current flowing through the inductive energy storing inductance 16 is commutated to the branch circuit including the free-wheel diode 13 as well as to the load 15 (capacitor 17). That is to say, the inductive energy ($LI_p^2/2$) stored in the inductance 16 initiates a resonance along a loop of inductance 16→capacitor 17→free-wheel diode 13.

The resonance current I may be represented by the following equation (1):

$$i - I_p \cos\omega t \tag{1}$$

The voltage Vc across the capacitor 17 is denoted by the following equation (2):

$$V_C = \frac{J_P}{\omega C}\sin\omega t = V_P \sin\omega t \tag{2}$$

Here, $$\omega = \frac{1}{\sqrt{LC}} = \frac{\pi}{2T_1} \tag{3}$$

In general, a waveform of the output voltage pulse is determined in accordance with the load 15. That is to say, a peak value $V_p$ (which corresponds to a discharge start voltage) of the output voltage Vc applied to the load 15 and a time duration $T_1$ from the time instance $t_1$ to a time instance at which the output voltage reaches its peak (a time interval of the second mode ID are given, and furthermore the capacitance C of the capacitor 17 is determined by the load 15. Moreover, the output voltage E of the DC voltage source 11 can be determined at will and may be set to a suitable value for the system under consideration.

Therefore, from the above mentioned equations (1)–(3), L and Ip may be obtained by the following equations; (4) and (5), respectively:

$$L = \frac{1}{C}\left[\frac{2T_1}{\pi}\right]^2 \tag{4}$$

$$Ip = \frac{\pi C V_p}{2T_1} \tag{5}$$

in order to flow the current $I_p$ to the inductive energy stone, inductance 16, a time period $T_0$ during which both the first and second switches 12 and 14 are made conductive is set in the following manner:

$$T_0 = \frac{LI_p}{E} = \frac{2V_p T_1}{\pi E} \tag{6}$$

Then, it is possible to obtain the high voltage pulse having a very narrow width. By controlling the time duration $T_0$ during which both the first and second switches are made conductive, a peak value of the output pulse can be adjusted freely without changing a width $T_1$ of a raising portion.

The output voltage Vc reaches its peak value at a time instance $t_2$, and a most efficient operation can be attained when the discharge is initiated in the load 15 at this timing $t_2$. However, the discharge is a very complicated phenomenon which depends upon temperature, humidity and gas condition, and it is quite difficult to explain the discharging operation quantitatively. Therefore, the explanation of the discharge is dispensed with in the present specification. In general, if a decrease in the output voltage Vc due to the discharge is not abrupt, undesired influence is applied to the discharge in a physical meaning. Therefore, it is advantageous to provide a mode IV in which the second switch 14 is turned-on at a time instance $t_3$ to decrease the output voltage Vc to zero forcedly.

As explained above, in the high voltage pulse generating circuit according to the invention, an extremely high voltage pulse can be generated by the very simple circuit using a less expensive and small low voltage DC source by effectively utilizing the semiconductor switches having the nun-off faculty instead of the thyratron which does not have a turn-off function. Furthermore, it is an important merit of the circuit according to the invention that the inductance of a circuit portion including the second switch 14 do not affect principally the generation of the output voltage pulse.

Figure 6:
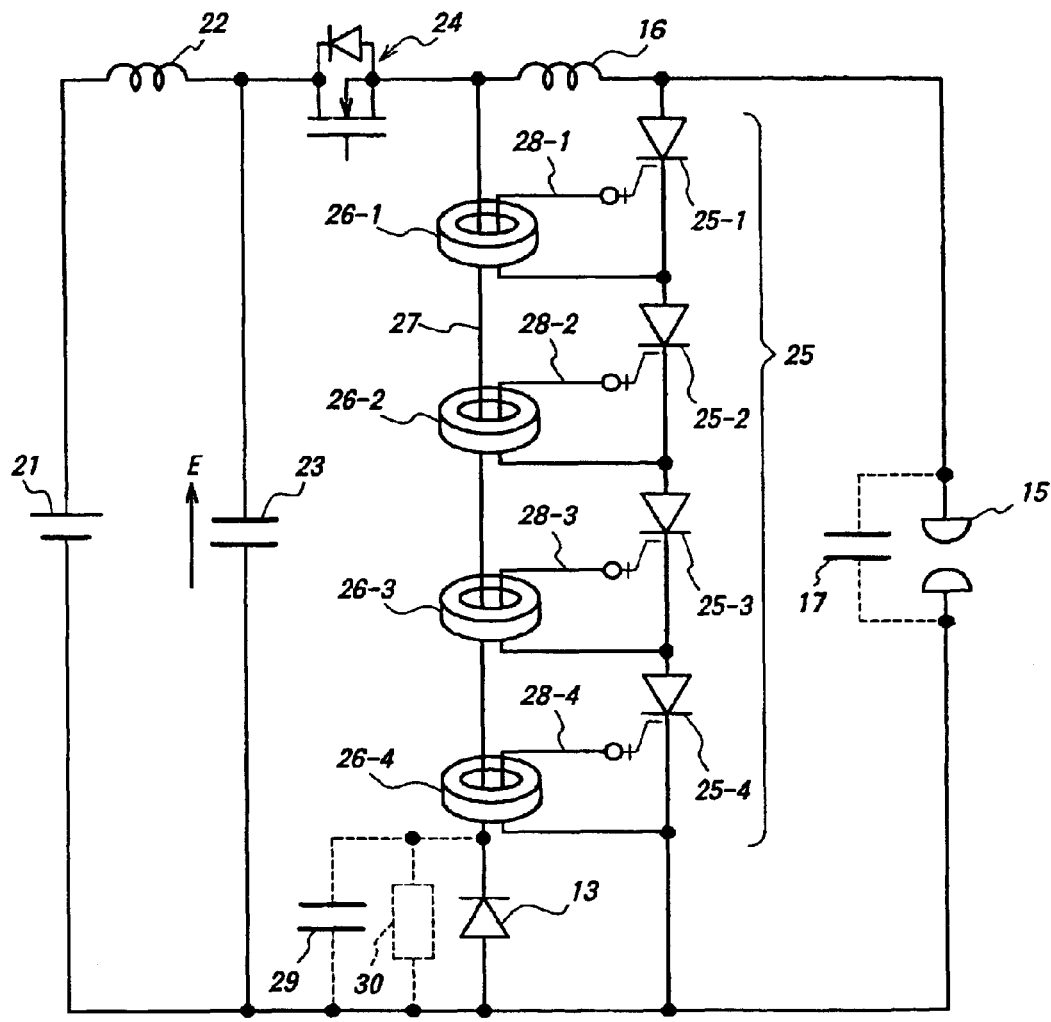
FIG. 6 is a circuit diagram showing a second embodiment of the high voltage pulse generating circuit according to the invention.

FIG. 6 is a circuit diagram showing a detailed arrangement of a second embodiment of the high voltage pulse generating circuit according to the invention. In FIG. 6, portions having similar functions as those of FIG. 4 are denoted by same reference numerals used in FIG. 4. To a DC voltage source 21 is connected a direct current smoothing circuit consisting of an inductor 22 and a capacitor 23 such that a high frequency impedance of the voltage source is sufficiently decreased and a pulse current can be supplied smoothly. In the present embodiment, the first switch 12 shown in FIG. 4 is formed a power MOSFET 24. As explained before, the first switch may have a lower withstand voltage, but it may be constructed by a parallel circuit of a plurality of power MOSFETs in accordance with a peak value Ip of the current passing through them. The second switch 14 shown in FIG. 4 is formed by a series circuit of a plurality of static induction thyristors 25-1~25-4. The series arrangement of these static induction thyristors 25-1~25-4 is denoted by 25. The number of the static induction thyristors 25-1~25-4 in the series arrangement is determined by the peak value $V_p$ of the output voltage pulse as well as by withstand voltages of these static induction thyristors. In the present embodiment, four static induction thyristors 25-1~25-4 are provided.

As stated above, when a plurality of the controllable semiconductor switching elements, in the present embodiment the four static induction thyristors 25-1~25-4 are connected in series, these semiconductor switching elements require respective gate driving circuits independently. Since the high voltage (maximum voltage is $V_p$) is applied between respective gaze driving circuits, a high withstand voltage isolation has to be provided between voltage source and control signals for these gate driving circuit. This results in an increase in size and cost of the circuit as well as in a decrease in reliability. In order to share the high voltage by the semiconductor switching elements equally, it is necessary to turn-on and turn-off these semiconductor switching elements abruptly. To this end, gate signals should be applied to the semiconductor switching elements simultaneously in a very precise manner. This requires a highly developed technique.

In the present embodiment, in order to solve the above mentioned problem, the static induction thyristors are not provided with respective gate driving circuits. That is to say, in the present embodiment, there are arranged a plurality of iron cores 26-1~26-4, the number of which is identical with that of the static induction thyristors 24-1~24-4, and a primary winding 27 constructed by the branch circuit including the free-wheel diode 13 is passed through the iron cores 26-1~26-4. Secondary windings 28-1~28-4 each connected across gates and cathodes of respective static induction thyristors 24-1~24-4 are passed through respective iron cores 26-1~26-4. In this manner, the primary winding 27 of a single turn are provided commonly for all the magnetic cores 24-1~24-4 and the secondary windings 28-1~28-4 of a single turn are provided for respective magnetic cores 24-1~24-4.

Next the operation of the second embodiment of the high voltage pulse generating circuit according to the invention will be explained with reference to FIG. 5. At a time instance $t_0$, the power MOSFET 24 is turned-on and a current flows from the capacitor 23 of the direct current smoothing circuit to the parallel circuit of a capacitor 29 and resistor 30 via the power MOSFET 24 and magnetic cores 261~264. The capacitor 29 operates as a speed-up capacitor for flowing a large current immediately after turning-off of the power MOSFET 24. The resistor 30 serves to flow an intermittent current. The same current flows in the secondary windings 28-1~28-4 coupled with the magnetic cores 26-1~26-4 in such a direction that a magnetic flux induced by the current flowing through the primary winding 27 is cancelled out These currents serve as on gate currents for the static induction thyristors 25-1~25-4, and these static induction thyristors are made on simultaneously 4 In this manner, the power MOSFET 24 and static induction thyristors 25 (all the static induction thyristors 25-1~25-4) are made conductive, and the current flows to the inductive energy storing inductance 16. After that, the circuit operates in the same manner as that of the above explained first embodiment Here, the current flowing to the inductive energy storing inductance 16 does not raise abruptly, and it is not necessary to turn-on the static induction thyristors 25-1~25-4 abruptly. Therefore, it is not always necessary to provide the capacitor 29, in which case only the resistor 30 may be arranged.

However, the turn-off operation of the static induction thyristors 25 constituting the second semiconductor switch differs from the first embodiment as will be explained hereinafter. When the power MOSFET 24 constituting the first semiconductor switch is turned-off at a timing $t_1$ at which the current passing through the inductive energy storing inductance 16 becomes the maximum value $I_p$, the current which has flown to the inductive energy storing inductance 16 is commutated to the branch circuit including the free-wheel diode 13. This current flowing along the primary winding 27 coupled with the magnetic cores 26-1~26-4, and currents having the same amplitude as that flowing through the primary winding flow through the secondary windings 28-1~28-4 in such a direction that the magnetic flux induced by the current flowing through the primary winding is cancelled out. These currents constitute gate turn-off currents for the static induction thyristors 25-1~25-4, and these static induction thyristors are turned-off simultaneously. It should be noted that the static induction thyristors 25-1~25-4 serving as the second switch have a relatively high withstand voltage and can turn-on and -off at a high speed. Such a static induction thyristor in the current driven device instead of the voltage driven device such as IGBT, and the larger the turn-on gate current and turn off gate current is, the faster the turn-on and turn-off operation is performed. Therefore, such a static induction thyristor is preferably utilized in an application requiring a fast operation such as a pulsed power application. When a turn-off gain (a ratio of the anode current to be turned-off to the gate turn-off current) is small, a storage time during the turn-off of the semiconductor switch can be shortened and a fall time can be also shortened. Therefore, the static induction thyristor can be particularly preferably used in the case in which anode current is identical with the gate turn-off current and the turn-off gain becomes unity like as the second embodiment.

In the second embodiment mentioned above, the gate turn-on current and gate turn-off of the static induction thyristors 25-1~25-4 are identical with each other and are large, and thus the static induction thyristors can be simultaneously turned-on and turned-off without time difference at a high speed. In this manner, the turn-on and -off operation can be performed reliably without any gate driving power source as well as independent gate signals.

In the first and second embodiments, at a suitable timing $t_3$ after the load 15 has initiated the discharging, the second semiconductor switch 14; 25 may be turned-on again to discharge the capacitor 17 at a high speed. This becomes an effective means for such a case that a discharge impedance of the load 15 is too high to discharge the capacitor 17 at a high speed and the physical phenomenon of the discharge is affected. The second semiconductor switch 14; 25 may be turned-on again by turning on the second semiconductor switch for a very short time period as illustrated by a broken line in FIG. 5B. Then, the output pulse voltage Vc can be decreased to zero instantaneously as shown by a broken line in FIG. 5H.

Figure 7:
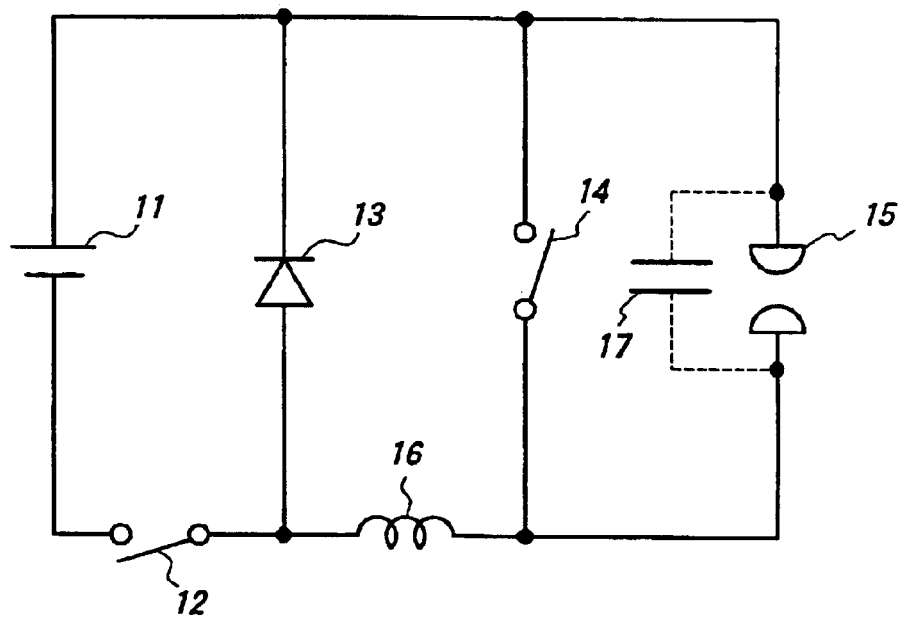
FIG. 7 is a circuit diagram illustrating a third embodiment of the high voltage pulse generating circuit according to the invention.

In the second embodiment, the first semiconductor switch is formed by the power MOSFET 24 and the second semiconductor switch is constructed by the static induction thyristors 25-1~25-4. It should be noted that these semiconductor switches may be formed by any other semiconductor switching element such as another type of transistors and IGBT (when it is used as the second semiconductor switch, a care should be taken in a point that it is a voltage driven device and a limitation is imposed upon a gate-emitter voltage). Furthermore, in the second embodiment, the second semiconductor switch is constituted by the series circuit of the four static induction thyristors 25-1~25-4, but according to the invention, the number of static induction thyristors is determined by a peak value of the output pulse voltage. It is a matter of course that the load is not limited to the capacitive discharge circuit. Moreover, the first switch 12 and inductive energy storing inductance 16 are connected to the positive output terminal of the direct current voltage source, but according to the invention, the same function can be attained by connecting the first switch and inductive energy storing inductance to the negative output terminal as shown in FIG. 7. Alternatively, one of the first switch 12 and inductive energy storing inductance 16 may be connected to the negative output terminal of the voltage source.

Figure 8:
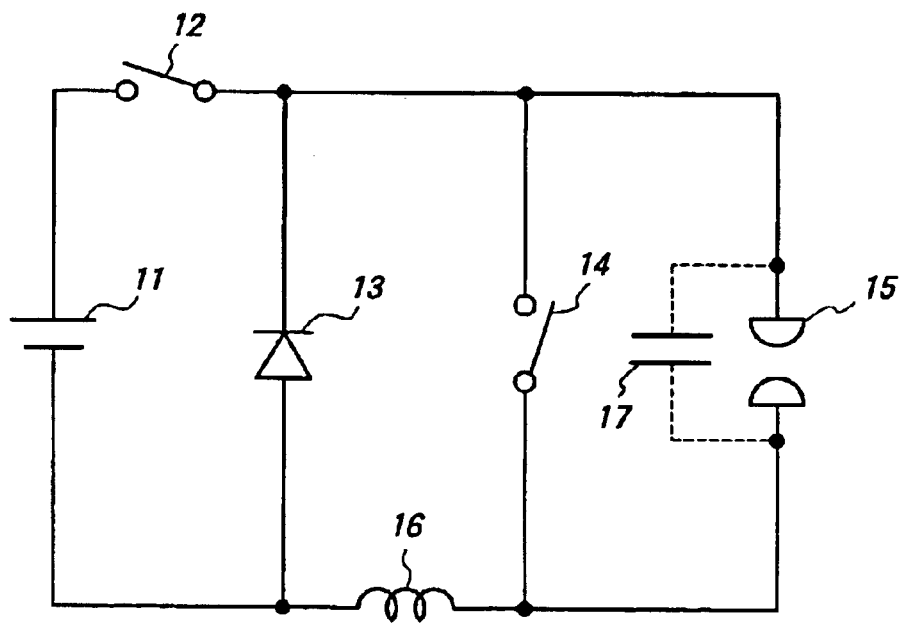
FIG. 8 is circuit diagram depicting a fourth embodiment of the high voltage pulse generating circuit according to the invention.

FIG. 8 shows a fourth embodiment of the high voltage pulse generating circuit according to the invention, in which a first switch 12 is connected to a positive output terminal of the DC voltage source 11 and a inductive energy storing inductance 16 is connected to a negative output terminal of the DC voltage source 11.

Figure 9:
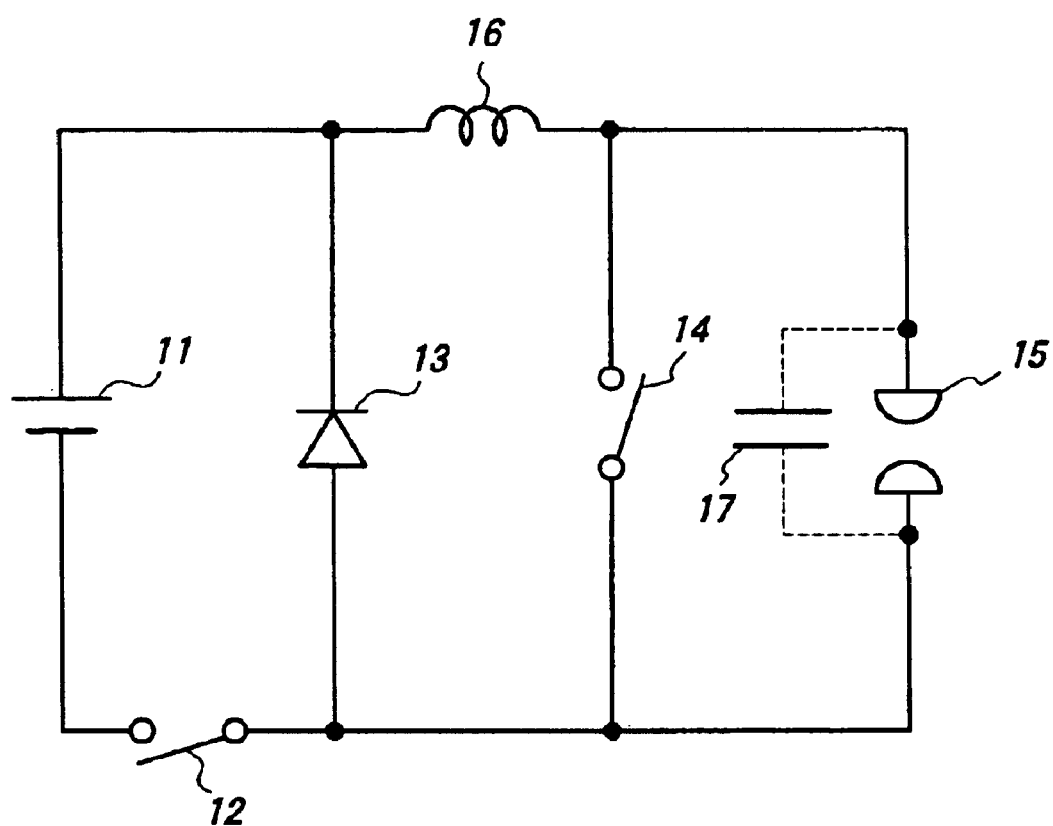
FIG. 9 is a circuit diagram showing a fifth embodiment of the high voltage pulse generating circuit according to the invention.

FIG. 9 depicts a fifth embodiment of the high voltage pulse generating circuit according to the invention, in which a first switch 12 is connected to a negative output terminal of the DC voltage source 11 and a inductive energy storing inductance 16 is connected to a positive output terminal of the DC voltage source 11.

In the above explained first to fifth embodiments of the present invention, each of the first and second switches are formed by a semiconductor switch and it is possible to generate a high voltage output pulse having an amplitude of several kVs to several tens kV and a pulse duration of several tens nano seconds to several hundreds of nano seconds.

What is claimed is:

1. A high voltage pulse generating circuit comprising:
   a DC voltage source having first and second output terminals;
   a first semiconductor switch having a low withstand voltage with turn-on and turn-off faculty and having one end connected to said first output terminal of said DC voltage source;
   a branch circuit including a free-wheel diode connected across the other end of said first semiconductor switch and said second output terminal of the DC voltage source; and
   a series circuit connected in parallel with said branch circuit and including an inductance and a second semiconductor switch with turn-on and turn-off faculty, said second semiconductor switch being constructed by a series circuit of a plurality of semiconductor switching elements having a high withstand voltage, the number of which is determined in accordance with an amplitude of an output voltage pulse to be generated, said circuit further comprises a plurality of iron cores, the number of which is equal to that of said plurality of semiconductor switching elements, a primary winding passing through said plurality of iron cores and being connected in series with said free-wheel diode and a plurality of secondary windings each passing through respective iron cores and being connected to gates and cathode terminals of respective semiconductor switching elements of said series circuit of semiconductor switching elements;
   wherein after turning said first and second switches on to store inductive energy in said inductance, the energy stored in the inductance is commutated to a load connected across said second semiconductor switch by turning said first and second semiconductor switches off.

2. The high voltage pulse generating circuit according to claim 1, wherein each semiconductor switching element of said series circuit of a plurality of semiconductor switching elements constituting said second semiconductor switch is formed by a static induction thyristor.

3. The high voltage pulse generating circuit according to claim 2, wherein said primary winding and secondary windings are wound on the iron cores by one turn.

4. The high voltage pulse generating circuit according to claim 2, wherein said first semiconductor switch having a low withstand voltage is formed by a power MOSFET.

5. The high voltage pulse generating circuit according to claim 1, wherein said first and second semiconductor switches are turned off substantially simultaneously.

6. The high voltage pulse generating circuit according to claim 1, wherein said second semiconductor switch is turned off immediately after said first semiconductor switch is turned off.

7. The high voltage pulse generating circuit according to claim 1, wherein a parallel circuit of a capacitor and a resistor is connected in parallel with said free-wheel diode.

8. The high voltage pulse generating circuit according to claim 1, wherein a resistor is connected in parallel with said free-wheel diode.

9. The high voltage pulse generating circuit according to claim 1, wherein said load is a discharge gap provided in a plasma generating reactor.

10. A high voltage pulse generating circuit comprising:
    a DC voltage source having first and second output terminals;
    a first switch having one end connected to said first output terminal of said DC voltage source;
    a branch circuit including a free-wheel diode connected across the other end of said first switch and said second output terminal of the DC voltage source; and
    a series circuit including an inductance and a second switch and being connected in parallel with said branch circuit;
    wherein after turning said first and second switches on to store inductive energy in said inductance, the energy stored in the inductance is commutated to a load connected across said second switch by turning said first and second switches off; and
    wherein said second switch is turned on again after turning off the second switch to discharge energy remaining in said circuit.

11. The high voltage pulse generating circuit according to claim 10, wherein said second switch is turned on again for a short time period after turning off the second switch to discharge energy remaining in said circuit.

* * * * *